(12) United States Patent
Savoy et al.

(10) Patent No.: US 9,423,301 B2
(45) Date of Patent: Aug. 23, 2016

(54) METHOD FOR MAKING WAVELENGTH-SELECTIVE, INTEGRATED RESONANCE DETECTOR FOR ELECTROMAGNETIC RADIATION

(71) Applicant: Nanohmics, Inc., Austin, TX (US)

(72) Inventors: Steve M. Savoy, Austin, TX (US); Byron G. Zollars, Georgetown, TX (US); Gennady Shvets, Austin, TX (US)

(73) Assignee: Nanohmics, Inc., Austin, TX (US)

( * ) Notice: Subject to any disclaimer, the term of this patent is extended or adjusted under 35 U.S.C. 154(b) by 0 days.

(21) Appl. No.: 14/718,166

(22) Filed: May 21, 2015

(65) Prior Publication Data

US 2015/0377703 A1 Dec. 31, 2015

Related U.S. Application Data

(63) Continuation of application No. 13/329,503, filed on Dec. 19, 2011, now Pat. No. 9,040,913.

(51) Int. Cl.

| | |
|---|---|
| *G01J 3/12* | (2006.01) |
| *H01L 31/18* | (2006.01) |
| *G01J 1/04* | (2006.01) |
| *G01J 5/08* | (2006.01) |
| *G01J 1/42* | (2006.01) |
| *G01J 3/02* | (2006.01) |
| *G01J 3/26* | (2006.01) |
| *G01J 3/28* | (2006.01) |
| *G01J 3/51* | (2006.01) |
| *G01J 5/02* | (2006.01) |
| *G01J 5/20* | (2006.01) |

(52) U.S. Cl.
CPC ............... *G01J 3/12* (2013.01); *G01J 1/0414* (2013.01); *G01J 1/0429* (2013.01); *G01J 1/0488* (2013.01); *G01J 1/42* (2013.01); *G01J 3/021* (2013.01); *G01J 3/0224* (2013.01); *G01J 3/26* (2013.01); *G01J 3/2803* (2013.01); *G01J 3/51* (2013.01); *G01J 5/024* (2013.01); *G01J 5/0809* (2013.01); *G01J 5/0825* (2013.01); *G01J 5/0862* (2013.01); *G01J 5/20* (2013.01); *H01L 31/18* (2013.01)

(58) Field of Classification Search
CPC ............... G01J 3/50; G01J 3/12; G01J 3/021; H01L 31/18
See application file for complete search history.

(56) References Cited

U.S. PATENT DOCUMENTS

2011/0128541 A1* 6/2011 Grueger et al. ............... 356/326

* cited by examiner

*Primary Examiner* — David Porta
*Assistant Examiner* — Faye Boosalis
(74) *Attorney, Agent, or Firm* — George L. Murphy; Murphy Strategic IP

(57) ABSTRACT

Embodiments of the invention are directed to integrated resonance detectors and arrays of integrated resonance detectors and to methods for making and using the integrated resonance detectors and arrays. Integrated resonance detectors comprise a substrate, a conducting mirror layer, an active layer, and a patterned conducting layer. Electromagnetic radiation is detected by transducing a specific resonance-induced field enhancement in the active layer to a detection current that is proportional to the incident irradiance.

11 Claims, 11 Drawing Sheets

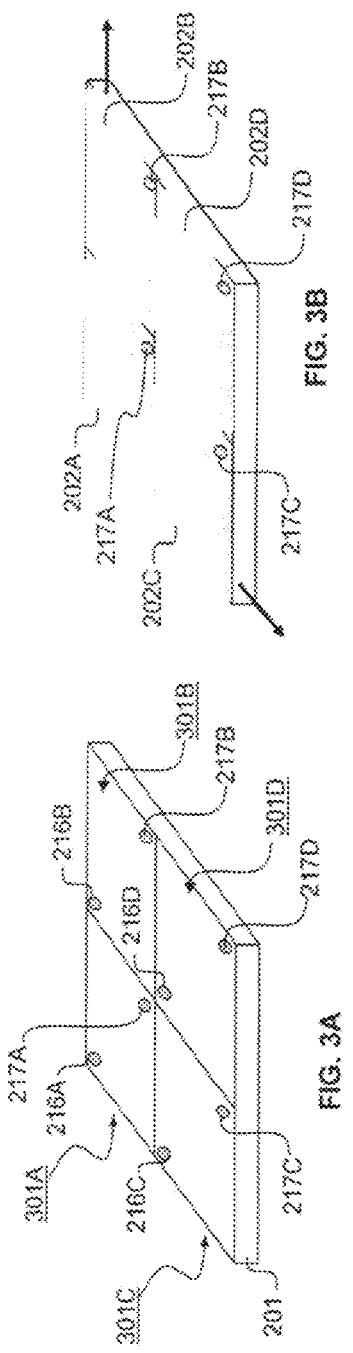
FIG. 3A
FIG. 3C
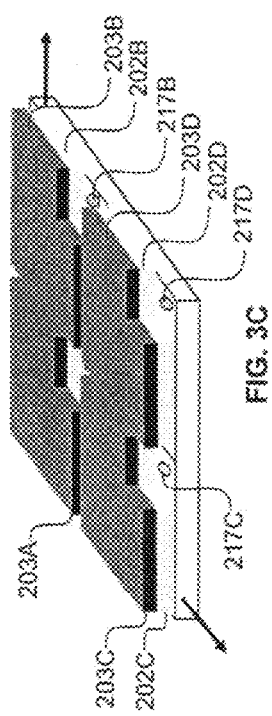
FIG. 3B
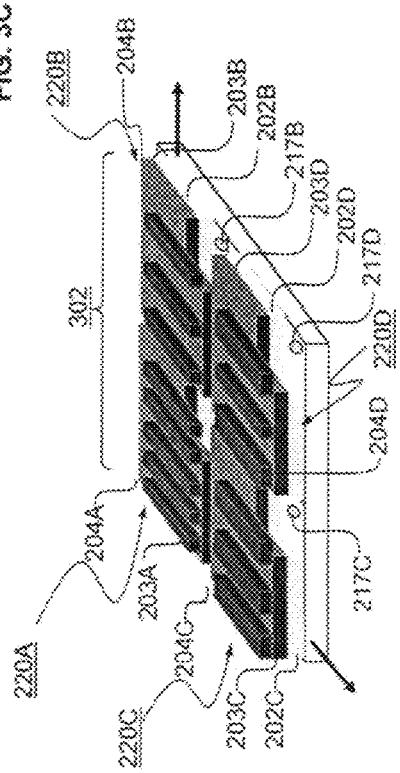
FIG. 3D
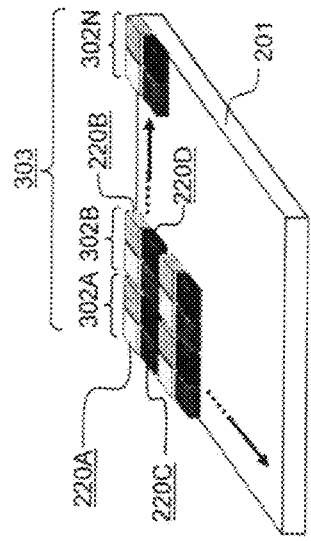
FIG. 3E

METHOD FOR MAKING WAVELENGTH-SELECTIVE, INTEGRATED RESONANCE DETECTOR FOR ELECTROMAGNETIC RADIATION

This is a continuation application and claims priority to U.S. application Ser. No. 13/329,503 filed on Dec. 19, 2011.

STATEMENT REGARDING FEDERALLY SPONSORED RESEARCH

The invention was supported, in whole or in part, by contracts W31P4Q-09-C-0512 "Nonlinear Plasmonic Devices" from the Defense Advanced Research Projects Agency (DARPA) and FA9550-10-C-0003 "Ponderomotive Field Effect Transistor" from the Air Force Office of Scientific Research, and N00014-09-M-0292 "Electromagnetic Metamaterial Films" from the Office of Naval Research (ONR). The U.S. Government has certain rights in the invention.

FIELD OF THE INVENTION

The present invention relates to the field of wavelength-selective detectors and arrays. More specifically, the invention relates to methods for making and using devices with subwavelength structures having wavelength-selective properties that are integrated with a detector for electromagnetic radiation detection, and the ability to make such devices into a flexible format.

BACKGROUND OF THE INVENTION

Over the past fifty years, technological advancements in microelectronics and microelectro-optics have proceeded at a rapid pace. As a result of this success, today's microfabricated devices and sensors are inexpensive, can be produced in large volumes, and can be fabricated with billions of sub-100 nm logic elements as small area microchips. One strong candidate for continued miniaturization is the integration of optical detectors with electronics for both logic processing and electromagnetic radiation detection (Kobrinsky, M., "On-chip optical interconnects" *Intel Technology*, 2004. 8, p. 129 and Ozbay, E., "Plasmonics: Merging photonics and electronics at nanoscale dimensions" *Science*, 2006, 311, p. 189). Optical signals offer an almost unlimited bandwidth and low loss, and therefore, it is highly desirable to couple optics and electronics at the wafer or device level to develop novel architectures. Pat. App. WO 2011/050272 A3 discloses nanoantenna arrays comprising plasmonic nanostructures or non-plasmonic nanostructures.

The inventors have realized a need for a detector that is integrated with a wavelength-selective element that can detect numerous narrow spectral regions over a broad region of the electromagnetic spectrum from ultraviolet to long wave infrared. Such a device can eliminate the existing requirement for multiple detectors and bulky wavelength-selective detection systems, which are expensive, large, and require high power levels to operate. A detector that provides this capability is not known in the art.

An array of integrated wavelength-selective detector devices, each having a sub-wavelength structure specific to a particular narrow band of wavelengths, can provide a means to detect a broad range of wavelengths for purposes of multi-spectral imaging. Such a method can provide a means to transduce multi-spectral responses from the ultraviolet, visible, infrared, and microwave regions of the electromagnetic spectrum using a single detector array structure. A method to control the feature dimensions of the sub-wavelength structure can provide a means to readily tune the device structure to interact with a wide range of specific wavelengths. Furthermore, methods for making the integrated wavelength-selective detector into large area detector arrays that are not subject to limitations imposed by single crystal substrates (i.e., inherently flexible or conformable substrates that can lead to curved detector geometries) can be advantageous. Such a device can benefit from the large bandwidth of signals that could be delivered directly from a fiber optic, or from broad wavelength-band (spectral) imagery, e.g., imaging applications such as hyperspectral imaging. Furthermore, large area detectors, with some level of conformability or flexibility, can open new applications in imaging such as device integration into textiles and other fabric material for covert surveillance. Monolithic detectors for broadband electromagnetic radiation detection can simplify and reduce the size, weight and power requirements for multiple mechanical systems required to achieve multi- and hyperspectral imaging today.

SUMMARY OF THE INVENTION

The inventors have developed a method for fabricating arrays of detectors with integrated wavelength-selective components. Embodiments of the invention provide a means for the assembly of a broad range of tunable detector structures precisely defined to resonantly couple with specific wavelengths of electromagnetic radiation. Each unique detector structure is electrically addressable such that resonantly-coupled electromagnetic radiation is transduced into a quantifiable electric current proportional to the incident power density in that specific spectral region.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIGS. 3A, 3B, 3C, 3D and 3E are schematic representations of an array of integrated resonance detectors.

DETAILED DESCRIPTION OF THE INVENTION

Embodiments of the invention are directed to ultraviolet, visible, and infrared photodetector arrays and methods for fabricating and using integrated resonance detectors, and arrays made thereof, for wide-angle, multi- and hyperspectral imaging. In certain aspects, devices and methods of the invention are useful for spectroscopic detection of electromagnetic radiation in the ultraviolet, visible, near infrared (NIR), short-wave infrared (SWIR), mid-wave infrared (MWIR), and long-wave, or far infrared (LWIR), or millimeter-wave, or microwave or combinations of these. Integrated resonance detector arrays of the invention enable narrow wavelength selection and the generation of electric current that does not depend on the absorptivity of a specific wavelength region by the detector material. Structural features of detectors of the invention can be lithographically patterned such that a resonance condition with sufficient field enhancement in the active layer produces measurable changes in electric current when illuminated with electromagnetic radiation that is in resonance with the structure.

Figure 1:
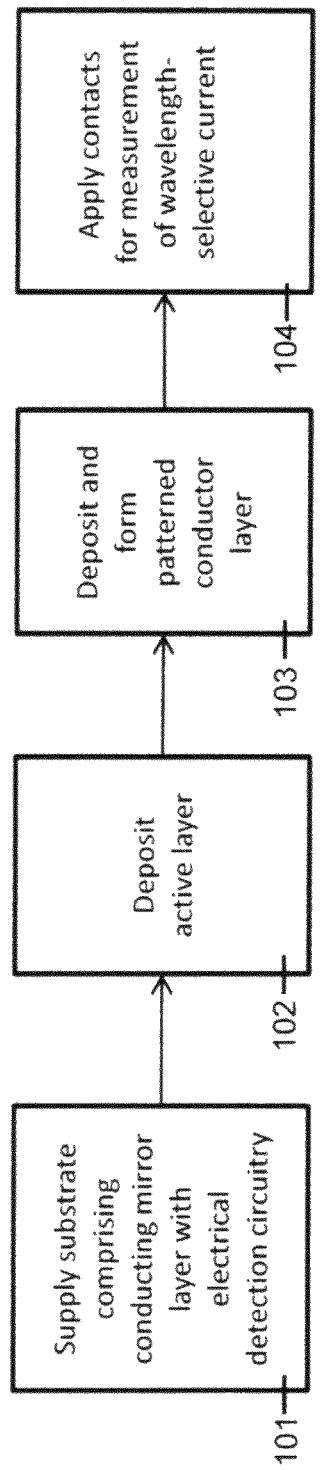
FIG. 1 is a flow chart diagram depicting the method for making an integrated resonance detector.

Referring to FIG. 1, the method for fabricating an integrated resonance detector is illustrated. In this example, a substrate is supplied in step 101. The substrate may be a semiconductor wafer a ceramic plate or alternatively, the substrate may be a glass or another "transparent" plate that is non-interacting with the full range of spectral bandpass of the integrated resonance detector. The substrate need not be a rigid material such as a wafer or plate; rather, it may be a flexible material, such as a metal foil with a mirror finish, a polymer or other amorphous sheet with a metal mirror layer deposited on the surface using techniques known in the art, such as evaporation, vapor deposition, plasma deposition, vacuum deposition, sputter deposition or electroless deposition. A number of possible flexible substrates are known in the art that could be used to fabricate the integrated resonance detector including metal, ceramic, plastic or biomaterials.

In some embodiments, the substrate may consist of a single photodetector, a linear photodetector, or a photodetector array such as a commercial image sensor or focal plane array. Portions of the photodetector array may be modified to accommodate additional detector elements fabricated by methods of the invention. The substrate may also be a portion of a wafer containing pre-fabricated electronic circuits that may or may not be associated with integrated resonance detectors.

The area of the conducting mirror layer generally defines the area for an integrated resonance detector. For arrays of integrated resonance detectors, the conducting mirror layer for each integrated resonance detector may be non-contiguous with neighboring integrated resonance detectors in the array. Arrays of electrically isolated conducting mirror layer that form isolated electrodes can be connected to individually addressable electronic circuits that may be present in the substrate.

Numerous methods are known in the art for depositing the active layer (step 102) comprising dielectric, semi-insulating, or semiconductor materials in the structure, including vacuum deposition and spin-on, or casting methods. In one embodiment, the active layer comprises a single composition such as doped-Si, or environmentally-stable semiconductors e.g. metal oxides such as ZnO, $In_2O_3$ or $SnO_2$. In other embodiments, the active layer includes a bilayer, or multi-layer structure which may include insulating barrier layers such as $SiO_2$ which can reduce dark current by acting as a tunnel barrier. In other embodiments, the active layer may be a composite mixture of materials that can affect the nonlinearity of the electric-field-induced current, for example, semiconducting nanoparticles mixed with a bulk insulating material that leads to variable range hopping current.

Following deposition of the active layer in step 102, a conducting layer is deposited and patterned with the desired feature dimensions for absorption of a specific wavelength range, in step 103. Typical dimensions of features of the patterned conducting layer corresponding to absorption in the short wave infrared band are on the order of hundreds of nanometer linewidths with tens to a few hundreds of nanometer gaps. The composition, lateral dimensions, and thickness of the patterned conductor layer together with the active layer thickness define the "resonance structure" that determines the resonance wavelength. The degree of wavelength specificity, or Q factor, is defined by controlling the materials, their dimensions, and the sharpness of the features. The patterned conductor layer is connected to a common electrode and the conducting mirror layer is connected to a separate electrode, in step 104. A bias voltage applied between the conducting mirror layer and the patterned conductor layer provides an electric field in the active layer, which in some cases causes a "dark current" in the absence of radiation that illuminates the detector. In certain embodiments, this current is low, or effectively zero. When resonance absorption conditions are met by incident external electromagnetic radiation, field enhancement in the active layer causes additional charge carriers to form and flow between the patterned conducting layer and the conducting mirror layer. The salient feature of the active layer is that it has nonlinearity in its current vs. voltage characteristic at the applied bias voltage. The purpose of the applied bias voltage is to maximize the amount of this nonlinearity. The active layer nonlinearity causes an asymmetry in the electromagnetic-wave-induced current oscillations in the active layer, which is subsequently measurable as a change in the time-integrated current. The nonlinearity in the current vs. voltage characteristic of the active layer rectifies the current induced by the incident electromagnetic radiation. The change in rectified current from "dark" to "illuminated" conditions provides a quantifiable indication of the irradiance of the selectively absorbed radiation.

In embodiments of the invention, the resonance structure is specifically designed to select a spectral band of electromagnetic radiation. The spectral band is not limited to any particular region of the electromagnetic spectrum, provided that suitable feature dimensions of the resonance structure are fabricated using high-definition patterning such as nanoimprint lithography (i.e., the smallest feature requirement being in the 10s of nanometers for ultraviolet absorption and the largest being in the millimeter range for microwave radiation). Likewise, the device response is not dependent on the absorptivity or band structure of a specific substrate material, rather, the incident radiation is transduced into an electric current in the active layer. Resonance structures that include two or more feature dimensions may be used to absorb multiple wavelengths. Amorphous materials that are deposited by evaporation, chemical vapor deposition, sputter-deposited, plasma-deposited, or spun-on are preferred for flexible substrates for integrated resonance detectors. The ability to fabricate integrated resonance detectors with high sensitivity and tunable wavelength selectivity on a flexible substrate is one of the unique features of the invention and is not known in the art.

Figure 2:
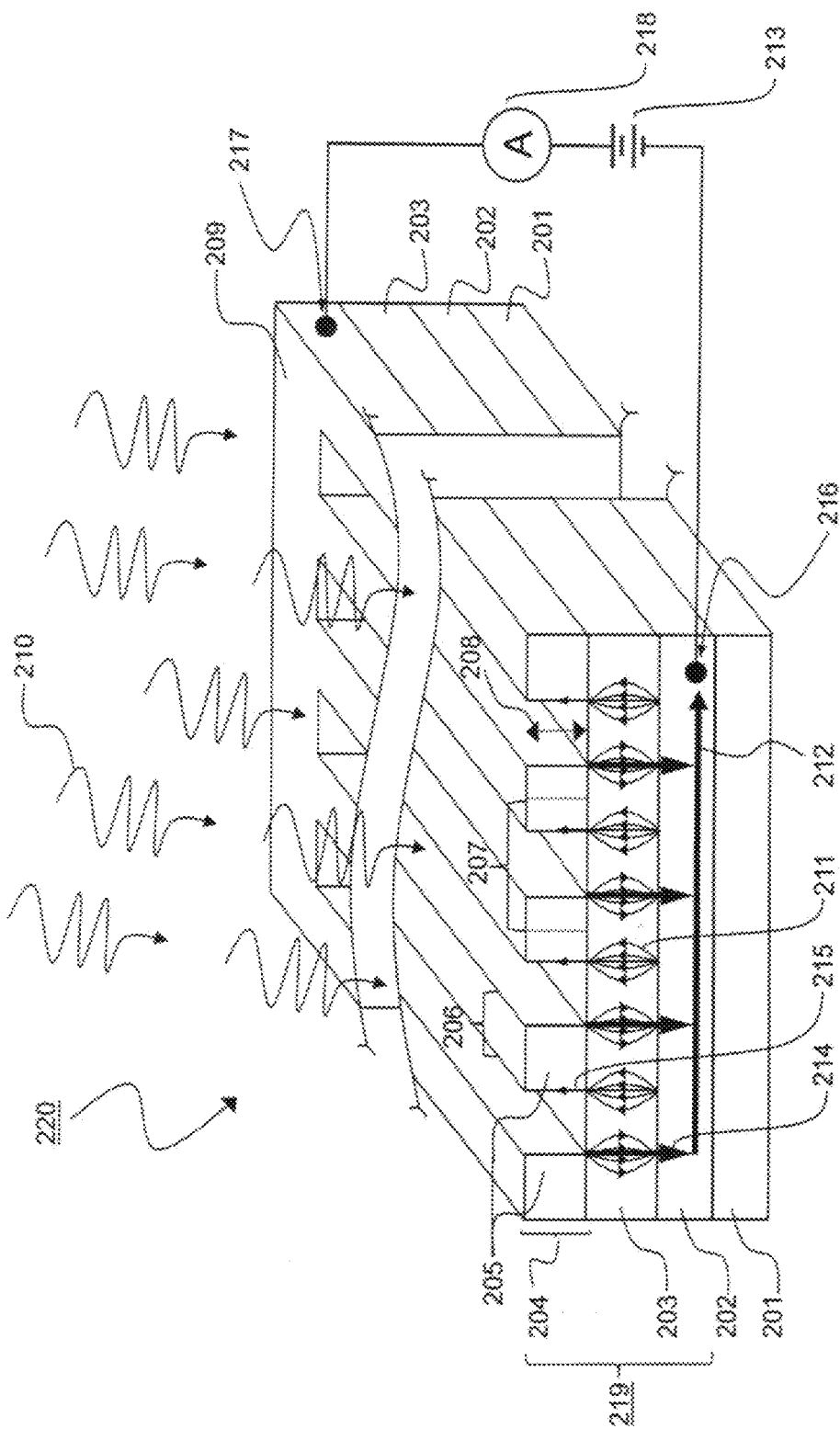
FIG. 2 shows a cross section view of an integrated resonance detector with current measurement across the structure.

FIG. 2 illustrates a cross-sectional view of one embodiment of an integrated resonance detector 220. Substrate 201 is first supplied. Substrate 201 may be either rigid (e.g., a plate or wafer), or flexible (e.g., a metal foil, or metallized film) and may comprise a number of singular materials such as plastic, ceramic, metal, glass, or semiconductor or a composite mixture of any two or more components. Depending on the substrate material, transparency to a particular spectral range may be enabled such that illumination of the detectors can be made either from the top of the structures, or through substrate 201. In the case of a transparent substrate 201, it may be advantageous to fabricate the individual layers of the integrated resonance detector in reverse order. Conducting mirror layer 202 is deposited on substrate 201 and active layer 203 is deposited onto conducting mirror layer 202. Conducting mirror layer 202 may be contiguous, or alternately, may be macroscopically patterned to electrically isolate regions of the device for the purposes of making each detector independently addressable in an array. Conducting mirror layer 202 may comprise any reflective conducting material including, but not limited to, noble metals or refractory metals. Active layer 203 may comprise numerous compositions, for example amorphous semiconductors, homogeneous mixtures of different compounds, alloys, inhomogeneous mixtures of nanomaterials, porous films, allotropic mixtures, or bilayer or multilayer stacks. Bilayer or multilayer stacks may include rectifying junctions such as diodes. The selection of the composition and thickness of the active layer is based on maximizing the nonlinearity in the current vs. voltage characteristic through the thickness of the active layer. Patterned conductor layer 204 is then deposited and patterned atop active layer 203. Patterned conductor layer 204 is generally metallic; however, the composition need only meet the requirements of resonance coupling and electrical conductivity to support a desired response to incident radiation. Subsequently, patterned conductor layer 204 is processed to form patterned features 205. Fabrication of patterned conductor layer 204 can be carried out using lithographic techniques, which may include nanoimprint lithography to achieve features small enough to support resonance coupling in the ultraviolet through SWIR regions.

In the diagram of FIG. 2, individual patterned features 205, in patterned conductor layer 204, are illustrated with a specific feature width 206 and pattern pitch 207. In certain embodiments, individual patterned features 205 are created by etching the full thickness 208 of patterned conductor layer 204 leaving a periodic series of electrically unconnected (isolated) patterned features 205. However, the etched thickness of patterned features 205 need not extend the full thickness 208 of patterned conductor layer 204, such as in the case when it is desirable to have a residual conducting plane for purposes of electrically connecting an array of features 205 (illustrated further in FIG. 7). In the case where the patterned features 205 are an array of lines, electrical continuity between all patterned features 205 in patterned conductor layer 204 can be provided with a bridging strip of conducting material 209. Bridging strip 209 may be part of the pattern, as depicted here, or may occur in a post-processing step. Placement of bridging strip 209 at one edge of patterned features 205 provides a means for all of the patterned features 205 of patterned conductor layer 204 to be electrically connected, but not interfere with the resonance coupling of electromagnetic radiation. A wide variety of techniques for depositing, patterning, etching, forming, and creating specific structures of integrated resonance detector 220 are known in the art. Operation of the novel integrated resonance detectors described here is not sensitive to the techniques used for fabrication, as long as the material characteristics and dimensions of the layers comprising the device are achieved and maintained across the lateral extent of the device.

The electrical conductivity of conducting mirror layer 202, the thickness of active layer 203, the thickness of patterned conductor layer 204, and the dimensions of the patterned features 205 of patterned conductor layer 204 are designed to selectively interact with, or absorb specific wavelengths of electromagnetic radiation 210. Together, these layers and their specific dimensions form the resonance structure 219. Upon absorption of radiation 210, resonance-induced field enhancement, represented by electric field lines 211, occurs between patterned conductor layer 204 and conducting mirror layer 202. Nonlinearity in the active layer 203 and the electric field enhancement 211 causes a net electric current 212 to flow to current measurement device 218, which is part of an electronic circuit connected to the resonance structure. In some cases an external voltage bias from an electromotive source 213 in the electronic circuit is applied across patterned conductor layer 204 and conducting mirror layer 202 to maximize the nonlinear characteristics of the active layer 203. Net current 212 is the result of the nonlinear rectification of the alternating electric field of electromagnetic radiation 210 during resonance coupling, and is the difference between the collective forward currents 214 and reverse currents 215, integrated over the lateral dimensions of the device. The electric current 212 is coupled to the external electric circuit from conducting mirror layer 202 through electrode terminus 216 on one side and through electrode terminus 217 on the other side which terminates at bridging strip 209. Bridging strip 209 is common to all the patterned features 205 of patterned conductor layer 204 making the whole layer a contiguous conductor. The magnitude of electric current 212 is measured using external current measuring device 218. The magnitude of electric current 212 for a given exposure interval can be used to determine the incident irradiance of electromagnetic radiation 210 incident on the detector surface, which could be a transistor amplifier such as a focal plane array, image sensor, bolometer or other electronics, such as that pertaining to, for example, photodetector arrays. Wavelength-selective, integrated detector structures provide a means for direct optical detection, across a wide spectral region, in a large area, flexible device format. Such a format would enable a detector that could accommodate parabolic geometries similar to the human eye.

In embodiments of the invention, efficient detection of wavelength-selective components of broadband electromagnetic radiation 210 is realized by the direct detection of resonantly absorbed radiation. This is superior to methods that employ external wavelength filtering elements. Conversely, nanoimprint lithography of integrated resonance detectors 220 enables the fabrication of a conducting mirror layer 202, active layer 203, and patterned conductor layer 204 to simultaneously serve as both the resonance coupler and transducer, thereby removing the requirement for a separate absorbing, or filtering layer.

In embodiments of the invention, the maximum detector current is obtained when incident electromagnetic radiation 210 is in resonance with the peak of the absorption curve for an integrated resonance detector 220 and therefore generates the largest field enhancement in active layer 203. Electromagnetic radiation 210 that is not in resonance with the structure does not result in electric field enhancement, and only the background current is measured. The background current is established for each integrated resonance detector 220 and is very small in most structure embodiments, such that the largest differential response is obtained during on-resonance illumination for a given integrated resonance detector 220. The electric field strength in active layer 203 is thus proportional to the incident field and also to the degree to which resonance occurs in the structure, the resonant bandwidth determined by the sharpness or Q-factor of the structure. The Q-factor is dependent, in turn, upon feature dimensions 205, the spatial variation of the dimensions, and the fabrication details of the device.

The specific resonance wavelength(s) for a given integrated resonance detector 220 depends on the size of the features 206 (i.e., 10 nm to 1 µm) in patterned conductor layer 204, the spacing of the features 207 (30 nm to 20 µm), the gap between features (10 nm to 20 µm), the thickness 208 of the features in patterned conductor layer 204 (1 nm to 1 µm), the buried conducting mirror reflectance, the active layer thickness (0.3 nm to 500 nm), and the properties of any other material that might be present in regions between features, and on the surface roughness of patterned conductor layer 204.

FIGS. 3A, 3B, 3C, 3D and 3E are schematic representations of an array of integrated resonance detectors. FIG. 3A shows substrate 201, upon which a 2×2 array of integrated resonance detectors 220A-D are to be fabricated represented by segmented regions 301A-D. Substrate 201 may comprise a conventional photodiode detector array that the integrated resonance detectors 220A-D may be fabricated upon. Substrate 201 may be designed such that all of the photosensitive elements thereon are integrated resonance detectors 220, or some fraction of the detectors are integrated resonance detectors 220 with the rest composed of photodiode detectors such as silicon photodiodes. For example, a silicon CMOS image sensor may be provided as substrate 201 with its associated read out electronics for each photodiode. A subset of the read out electronics may be directed to connect with integrated resonance detectors 220 that may be patterned and assembled in the method illustrated in FIG. 3. Integrated resonance detectors 220 incorporated into existing CMOS photodetector arrays may add functionality such as infrared detection to an existing CMOS device.

In another embodiment, substrate 201 may wholly comprise a material with special optical, mechanical, or electrical characteristics such as a glass slide for optical transparency. In still another embodiment, substrate 201 may comprise a large area polymer film. The polymer film may provide a means for making large area sheets of integrated resonance detector arrays using low cost roll-to-roll manufacturing methods. In the embodiment where integrated resonance detectors 220 are deposited directly on a polymer film, patterned electrodes, may be present on the entire array surface or on selected regions of the surface of substrate 201 where the integrated resonance detector 220 array is formed.

The two electrode terminals, 216 for conducting mirror layer 202 and 217 for patterned conductor layer 204, respectively, for each of the four (2×2) segmented regions 301A-D that will be used to fabricate four integrated resonance detectors 220A-D are also depicted in FIG. 3A. The contacts are depicted as buried leads interfacing to some circuitry not visible in the figure. In practice, numerous methods exist in the art for fabricating electrical interconnects and electrode contacts or terminals that provide connectivity to the read out electronics for individual elements in the array.

FIG. 3B shows distinct, arrayed conducting mirror layer segments 202A-D deposited onto the four segmented regions 301A-D of substrate 201. Deposition is carried out such that each conducting mirror layer 202A-D makes electrical contact with its respective electrode terminal 216A-D. The electrical connection occurs beneath conducting mirror layer 202A-D and is not visible in the figure. In this embodiment, the remaining patterned conductor layer terminals 217A-D are left exposed, or are etched back to form a via, or through-hole, using lithographic processes. Deposition of conducting mirror layers 202A-D is followed by deposition of active layers 203A-D, FIG. 3C. Active layer 203 may consist of a number of materials with electrical properties ranging from insulating, semi-insulating, and semi-conducting and may include bilayer, trilayer, or multilayer structures in order to derive the properties necessary for field enhancement-induced current generation. Depending on the composition of active layer 203, numerous methods for deposition may be employed. Like deposition of conducting mirror layer 202, active layer 203 is generally not deposited over electrode terminals 217A-D. FIG. 3D illustrates the deposition and lithographic processing of patterned conductor layer 204A-D over active layer 203A-D. Generally, this layer completes the resonance structures 219 that results in the formation of integrated resonance detectors 220A-D. Patterned conductor layer 204 can be deposited using various deposition techniques described previously for conducting mirror layer 202. In some embodiments, patterned conductor layer 204 is the same composition as conducting mirror layer 202, but this is not a requirement. Numerous metal options are useful including high temperature metals and refractory metals such as tungsten and molybdenum for applications such as thermophotovoltaic devices.

Lithographic processing of patterned conductor layer 204A-D is carried out using methods that can achieve the necessary feature dimensions. Long wave infrared devices will have large feature dimensions that are readily attainable with standard lithography methods well known in the art. If feature dimensions commensurate with short wave infrared radiation, near-IR, or visible are desired, then lithographic techniques that can create nanoscale features are necessary. The figure illustrates different sizes and pitches for each segmented region 301A-D that are formed in patterned conductor layer 204A-D. In some embodiments, nanoimprint lithography (NIL) is a useful method for creating nanoscale features. NIL provides a means for making integrated resonance detectors that are useful for detecting radiation having short wavelengths. Similarly, methods of roll-to-roll nanoimprint lithography, such as by way of example only, those described by Guo, L. et al., U.S. Patent Appn. No. 2009/0046362, which is hereby incorporated by reference, may be used to manufacture arrays of integrated resonance detectors 220.

In FIG. 3D, the set of four (2×2) integrated resonance detectors 220A-D are illustrated. A final connection between patterned conductor layer 204A-D and patterned conductor electrode terminals 217A-D is made. This can be performed by a number of different methods well known in the art, including the use of bridging strip 209 depicted previously in FIG. 2. This step is not illustrated in FIG. 3D for clarity. Electrical connection of integrated resonance detectors 220A-D to the underlying electrical circuit below segmented regions 301A-D results in the formation of a 2×2 array of integrated resonance detectors 220A-D which in this figure represent a "unit cell" 302 of a larger integrated resonance detector array depicted in FIG. 3E.

In some applications, as illustrated in FIG. 3E, numerous unit cells 302A-N can be repeated across substrate 201 to form a large array 303 of integrated resonance detectors. An embodiment of large array 303 would consist of a multiple unit cells 302 fabricated on a plate or flexible roll substrate 201, and need not include regular spacings of integrated resonance detectors 220. In another embodiment, large array 303 may comprise an entire array of unique integrated resonance detectors 220 in any number of positional assemblies. Using lithographic processes such as NIL, the patterning of the patterned conductor layer 204 for all elements of the entire large array 303 of integrated resonance detectors can be fabricated during a single imprint transfer process.

The substrate 201 for an array of integrated resonance detectors 220 may be an array of electric circuits of an image sensor or focal plane array in which integrated resonance detectors 220 are registered to specific areas in the substrate, overall forming a photodetector. In some instances, the photodetector may be a hybrid that includes traditional silicon photodetectors mixed with integrated resonance detectors 220 of the present invention. In other aspects of the invention, the detector may be a silicon, InGaAs, InSb, or HgCdTe focal plane array or image sensor that includes spectral filter mosaic layer elements replaced with integrated resonance detectors 220 in such a fashion that electrical addressability is maintained with the underlying photodetector circuit elements.

Figure 4:
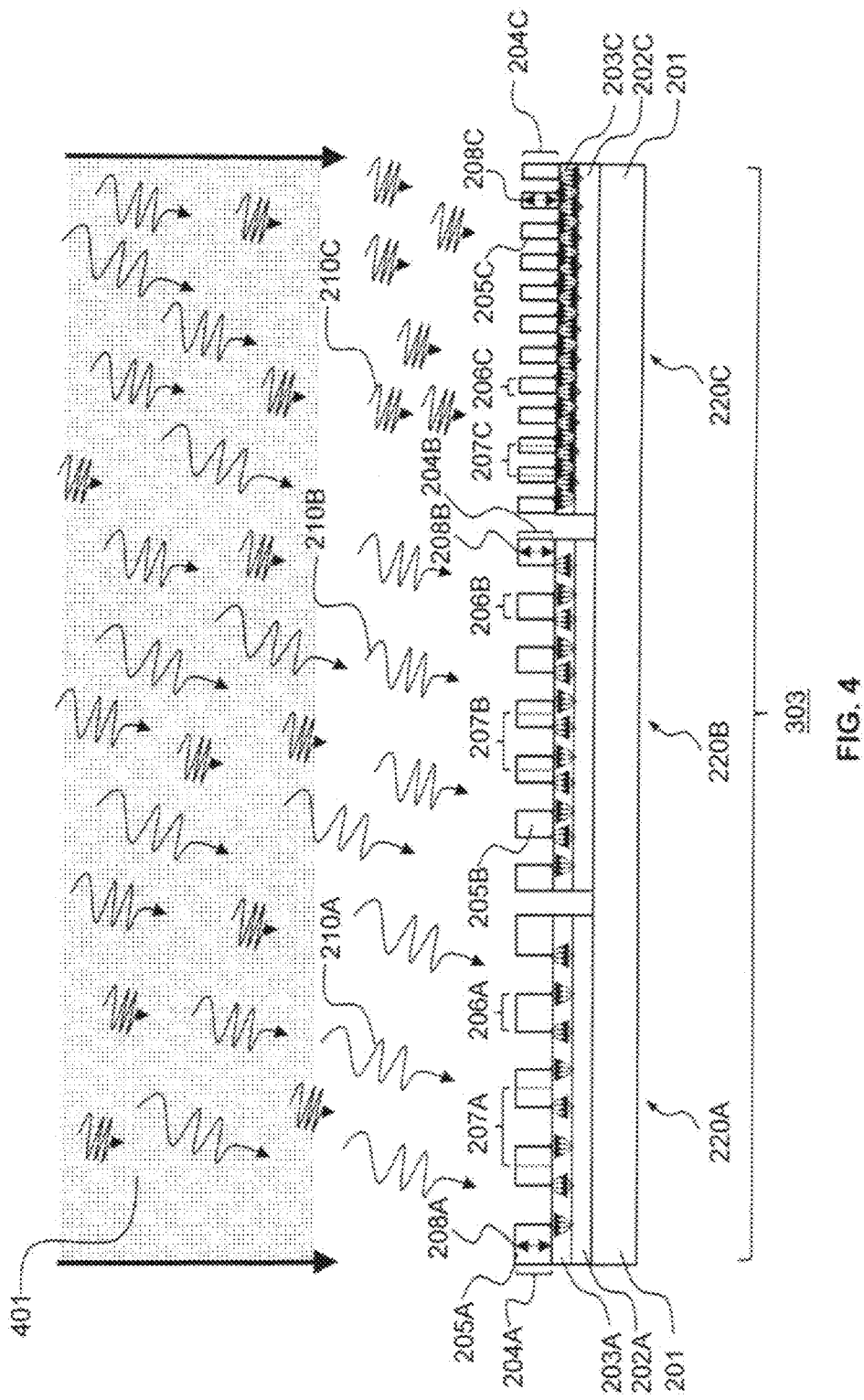
FIG. 4 is a cross section diagram of an array of integrated resonance detectors responding to different wavelengths of electromagnetic radiation.

A large array 303 of integrated resonance detectors 220 that has been designed with different sets of feature dimensions so as to interact with a selected range of wavelengths of electromagnetic radiation is illustrated in the cross-sectional diagram in FIG. 4. Broadband electromagnetic radiation 401 is incident on large array 303. In FIG. 4, three different wavelengths of electromagnetic radiation represented by 210A-C are shown at the bottom of broadband electromagnetic radiation 401 and are meant to illustrate that specific wavelengths are absorbed only by the respective integrated resonance detector 220 with the correct feature dimensions for resonance with that wavelength (A specific example is illustrated later in FIG. 9). In practice, broadband electromagnetic radiation 401 impinges on all of the integrated resonance detectors 220 in the array, but only radiation 210 matching the conditions for resonance, in any given detector 220, is absorbed. Unabsorbed radiation is either reflected by conducting mirror layer 202 or passes through integrated resonance detector 220.

The cross-sectional diagram of FIG. 4 illustrates three unique integrated resonance detectors 220A-C. The feature dimensions 205A-C of patterned conductor layer 204A-C and their thicknesses 208A-C and the thicknesses of the active layers 203A-C serve to spectroscopically "filter" or "absorb" electromagnetic radiation by virtue of "resonance" with a specific narrow set of wavelengths 210A-C, respectively, from broad spectrum radiation 401. The feature width 206A and feature pitch 207A of patterned conductor layer 204A are larger than the corresponding feature width 206B and feature pitch 207B which are, in turn, larger than the feature width 206C and pitch 207C in this illustration. This progression of feature dimensions 205A-C is represented in FIG. 4. As an example, FIG. 4 indicates an embodiment where feature dimensions 205A may be sized to interact with short wave infrared radiation (SWIR) 210A, the feature dimensions 205B are sized to interact with near infrared radiation (NIR) 210B, and the feature dimensions 205C are sized to interact with visible radiation (VIS) 210C regions of electromagnetic radiation. Similarly, all three feature dimensions 205A-C may be sized to resonate with narrow but distinct spectral regions in any given spectral band. In embodiments of the invention, the degree of interaction is defined by the feature dimensions 205 and material composition which are selected for the desired application. In aspects of the invention, detectors and methods for detecting can be broadly applied to any portion of the electromagnetic spectrum provided that patterned conductor layer 204 is patterned with feature dimensions 205 that are selected for interaction with the desired radiation range.

Figure 5:
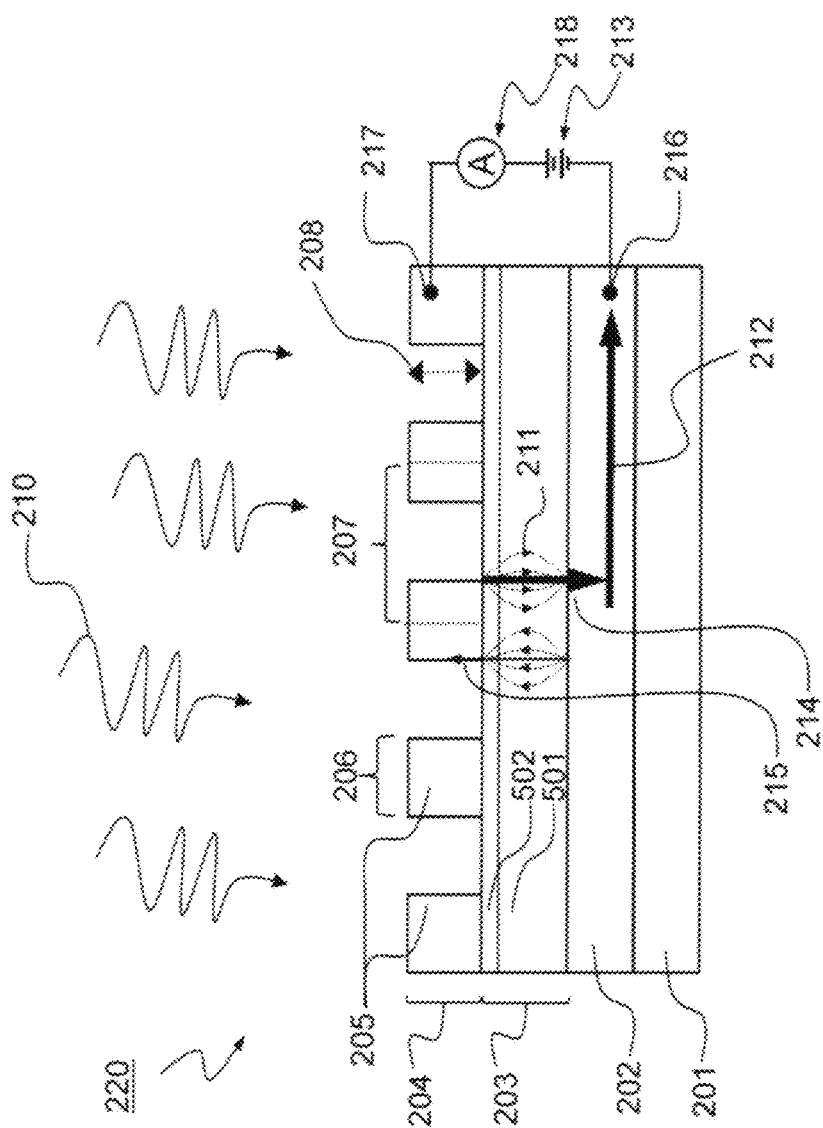
FIG. 5 is a schematic representation of the embodiment comprising a bilayer active layer.

FIG. 5 shows an embodiment of integrated resonance detector 220 where active layer 203 is composed of a bilayer structure. In the example, the majority composition 501 of active layer 203 may be a semiconductor or a material with relatively high electrical conductivity that supplies a large number of charge carriers. A secondary layer 502 such as a thin semi-insulating or insulating barrier layer may be provided that serves as a potential barrier or tunnel junction. Barrier layer 502 may provide an initial barrier to electric current flow, but may begin conduction under sufficient electric field achieved via electric field enhancement 211, thereby enabling the flow of net electric current 212. In this illustration, only a select few electric field lines 211 are presented for clarity to show the regions of highest electric field strength and the relationship to the geometry of patterned conductor layer 204. When the optical resonance conditions are met, i.e., when integrated resonance detector 220 absorbs the specific wavelength of electromagnetic radiation intended by resonance feature dimensions 205, electric current 212 will flow between patterned conductor layer 204 and conducting mirror layer 202 through active layer 203 via electrode terminals 216 and 217, to be quantified in external circuit 218. In this embodiment, barrier layer 502 can be thought of as a nonlinear electric-field-actuated switch which provides a means to suppress background or dark current when either no radiation or off-resonance radiation is incident on integrated resonance detector 220. When resonance conditions are met, field enhancement 211, in conjunction with any externally-supplied bias voltage 213, provides sufficient electric field strength to barrier layer 502 to provide a means to induce flow of electric current 212. Barrier layer 502 is useful to enhance the ratio of the detected electric current 212 to the background electric current and may influence the nonlinearity that produces the difference between forward current 214 and reverse current 215 that leads to net electric current 212 The illustration represented in FIG. 5 is just one example of a bilayer structure that may be used to enhance the on/off ratio of electric current 212 relative to background and/or active layer nonlinearity. Active layer 203 may comprise bilayer, trilayer, or multilayer structures in various embodiments of the invention. Functionally, the active layer 203 may have the characteristics of one or more of the following: semiconductor junctions, barrier junctions, Frenkel-Poole hopping layers, Fowler-Nordheim tunneling layers, field-emission layers, or ballistic carrier transport layers.

Figure 6:
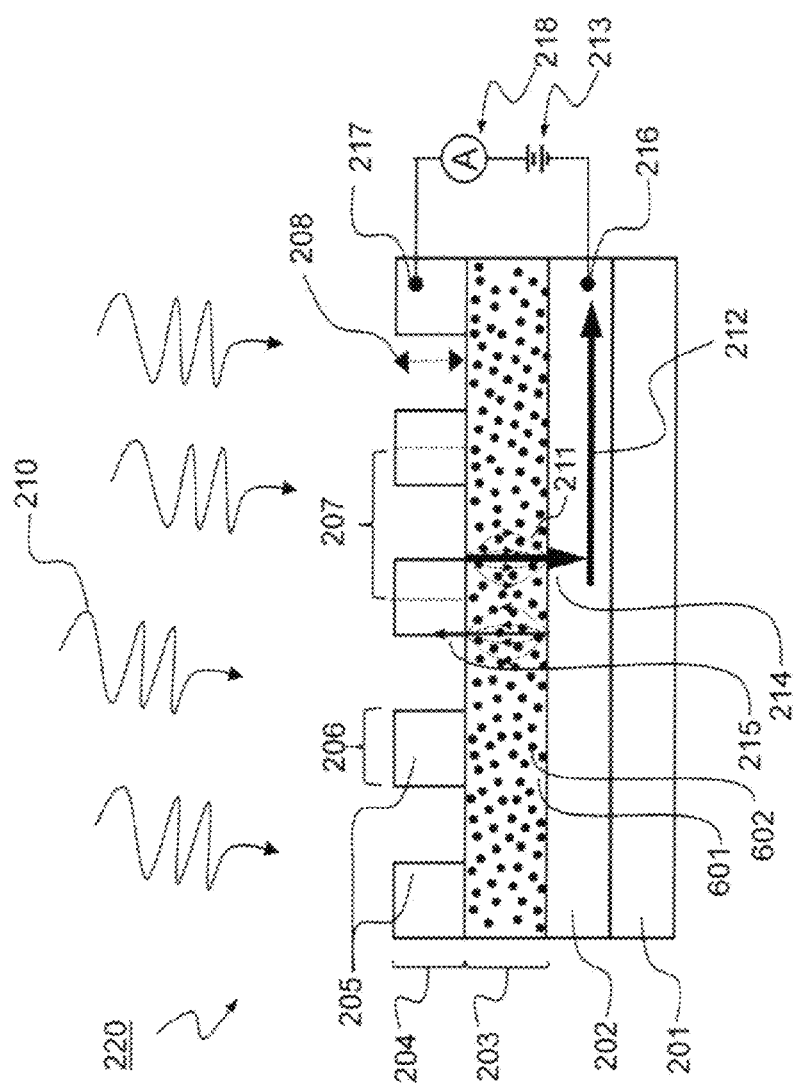
FIG. 6 is a schematic representation of the embodiment comprising a composite active layer with two materials.

In a similar fashion to that illustrated in FIG. 5, FIG. 6 shows an embodiment of an integrated resonance detector 220 where active layer 203 is composed of a composite mixture of two solid compounds. In this example, the majority, or "bulk" material 601 of active layer 203 could be a semi-insulator that supports zero or small dark current flow under external bias. A secondary component 602, such as semiconducting or metallic nanoparticles, may be provided for supporting flow of electric current 212 under applied bias 213 in conjunction with sufficient field enhancement 211. In one embodiment, applied bias 213 polarizes the charge carriers on secondary component 602, but is not sufficient to lead to flow of net electric current 212 directly. When the optical resonance conditions are met, i.e., when integrated resonance detector 220 interacts with a specific wavelength of electromagnetic radiation as determined by resonance layer feature dimensions 205, electric current 212 will flow between patterned conductor layer 204 and conducting mirror layer 202 through electrode terminals 216 and 217, to be quantified in external circuit 218. The mode of current flow may be variable range hopping between individual particles of secondary component 602 that are mixed with bulk material 601 in some predetermined concentration. This condition would only occur when the combination of the electric field supplied by applied bias 213 plus electric field enhancement 211 is sufficient to enable charge carriers to overcome the potential barrier imposed between individual particles of secondary component 602 in bulk material 601. Fabrication of any number of ratiometric mixtures of two solid components to achieve the optimum nonlinear current-voltage characteristic are envisioned in various embodiments of the invention, non-limiting examples of ratiometric mixtures include semiconductor nanoparticles such as indium or tin oxide in a polymeric film, or conducting nanoparticles such as gold in a spin-on glass of silicon dioxide. Secondary component 602 and bulk material 601 may comprise ratiometric mixtures of conductors, semiconductors, semi-insulators, or insulators that form a composite active layer 203.

In some aspects of the invention, patterned conductor layer 204 is composed of parallel lines, or "grooves" forming a grating-like structure. This pattern was illustrated previously in FIG. 2-6 in isometric view. In this embodiment, integrated resonance detector 220 may respond to specific polarizations of electromagnetic radiation in addition to specific wavelengths. The ability to intersperse polarization-dependent integrated resonance detectors of different orientations into the distribution of wavelength-selective components is one of the compelling features of the invention. Spectro-polarization or polarization images may be useful in applications such as surveillance where man-made objects are known to reflect polarized light differently than natural objects. An important feature of the groove, or "strip" structure is that a single, common bridging strip 209 that traverses all of the resonance lines can connect all the resonance lines to a common electrode terminal 217. Bridging strip 209 can be positioned so as not to interfere with the optical resonance and serves only to enable electrical continuity between patterned features 205 of patterned conductor layer 204.

Figure 7:
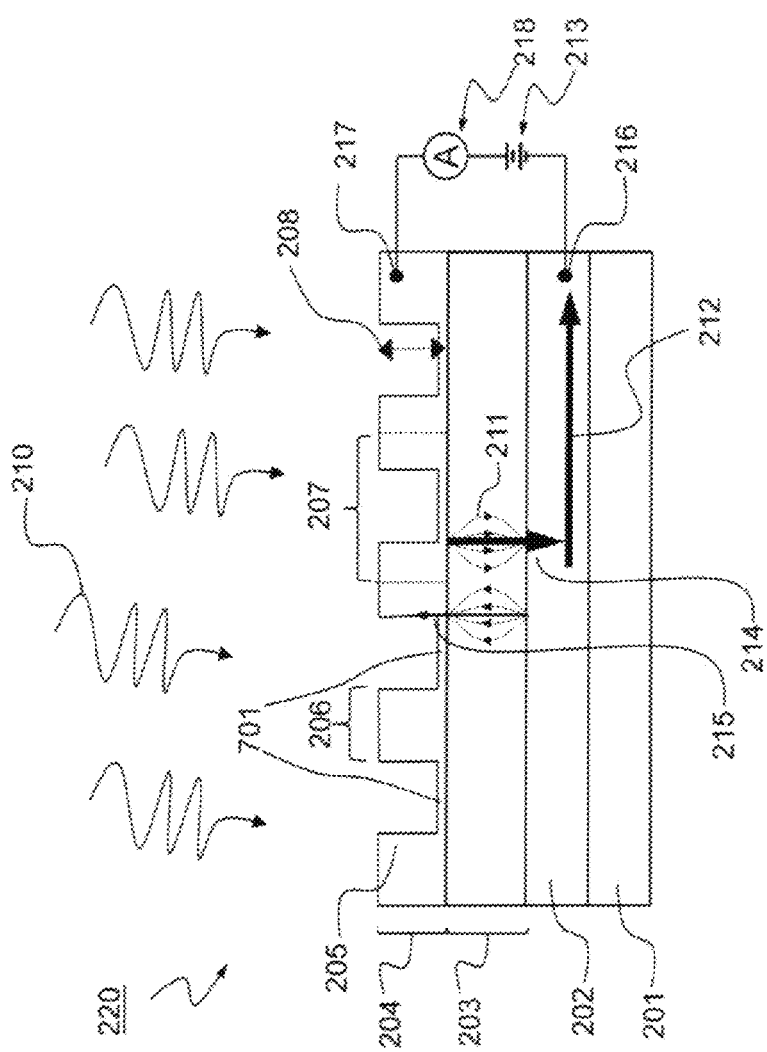
FIG. 7 is a diagram of an array of integrated resonance detectors depicting a thin layer that forms an array of patterned conductor features that are electrically contiguous, but does not interfere with resonance absorption.

An alternative method to create electrical continuity between the patterned features 205 of patterned conductor layer 204 is to leave a thin continuous film 701 below the features, FIG. 7. Thin continuous film 701 is sufficiently thin so as to not interfere with optical resonance, but is sufficient to carry current from patterned conductor layer 204 to the external circuit in a similar fashion to bridging strip 209. This method is amenable to all feature shapes including the set of parallel lines shown in FIG. 2, or for example, a cross-hatch, or array of squares or pillars, hexagonal arrangements and other two dimensional geometries. Devices fabricated with cross-hatched patterned conductor layers 204 may provide polarization-independent absorption, thus functioning solely as a wavelength-selective detector or detector array.

Figure 8:
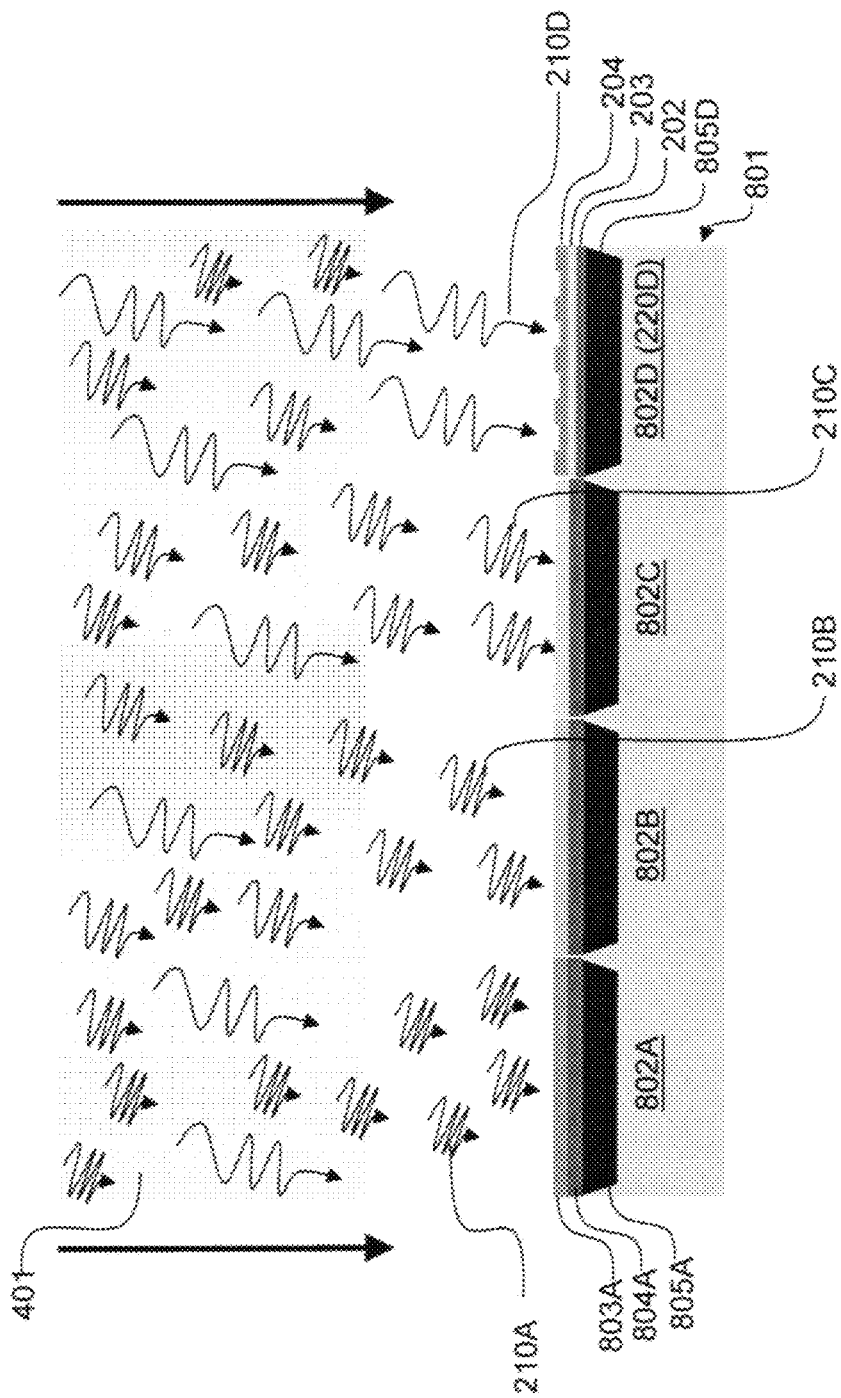
FIG. 8 is a schematic diagram illustrating an array of integrated resonance detectors in which an integrated resonance detector is interdispersed within the photosensitive elements of a CMOS image sensor bearing a color filter array.

FIG. 8 shows a schematic representation of one example in which integrated resonance detector 220 is incorporated as a subcomponent at the pixel level of a silicon CMOS image sensor 801 acting as substrate 201. In the figure, four active silicon CMOS detection regions, or "pixels" are represented by 802A-D. Each pixel comprises a filter layer 803, a photoactive area 804 and a detector circuit 805 that is manufactured to be addressable by an external multiplexer and read-out amplifier circuit. In the embodiment depicted in FIG. 8, one of the silicon CMOS sensor pixels 802D is replaced by an integrated resonance detector 220D. FIG. 8 depicts patterned conductor layer 204 in registration with a single pixel 802D in the detector array. One-to-one registration of integrated resonance detector 220 with underlying detector array pixel 802 is not required. Integrated resonance detector 220D can be designed to selectively absorb SWIR or MWIR radiation, for example, which would not otherwise be detected by silicon CMOS image sensor photoactive areas 802A-C. Integrated resonance detector 220D could be interfaced to detector circuit 805D in the same manner pixels 802A-C are interfaced to detector circuits 805A-C. This could be accomplished during manufacturing or possibly included in a retrofit application of an existing CMOS image sensor. In either embodiment, the principle of increasing the wavelength range of detection by inclusion of integrated resonance detectors applies. Numerous embodiments exist for the arrangement of detector pixels 801 and integrated resonance detectors 220 that would enable a monolithic UV, VIS, NIR, and SWIR detector array.

Figure 9:
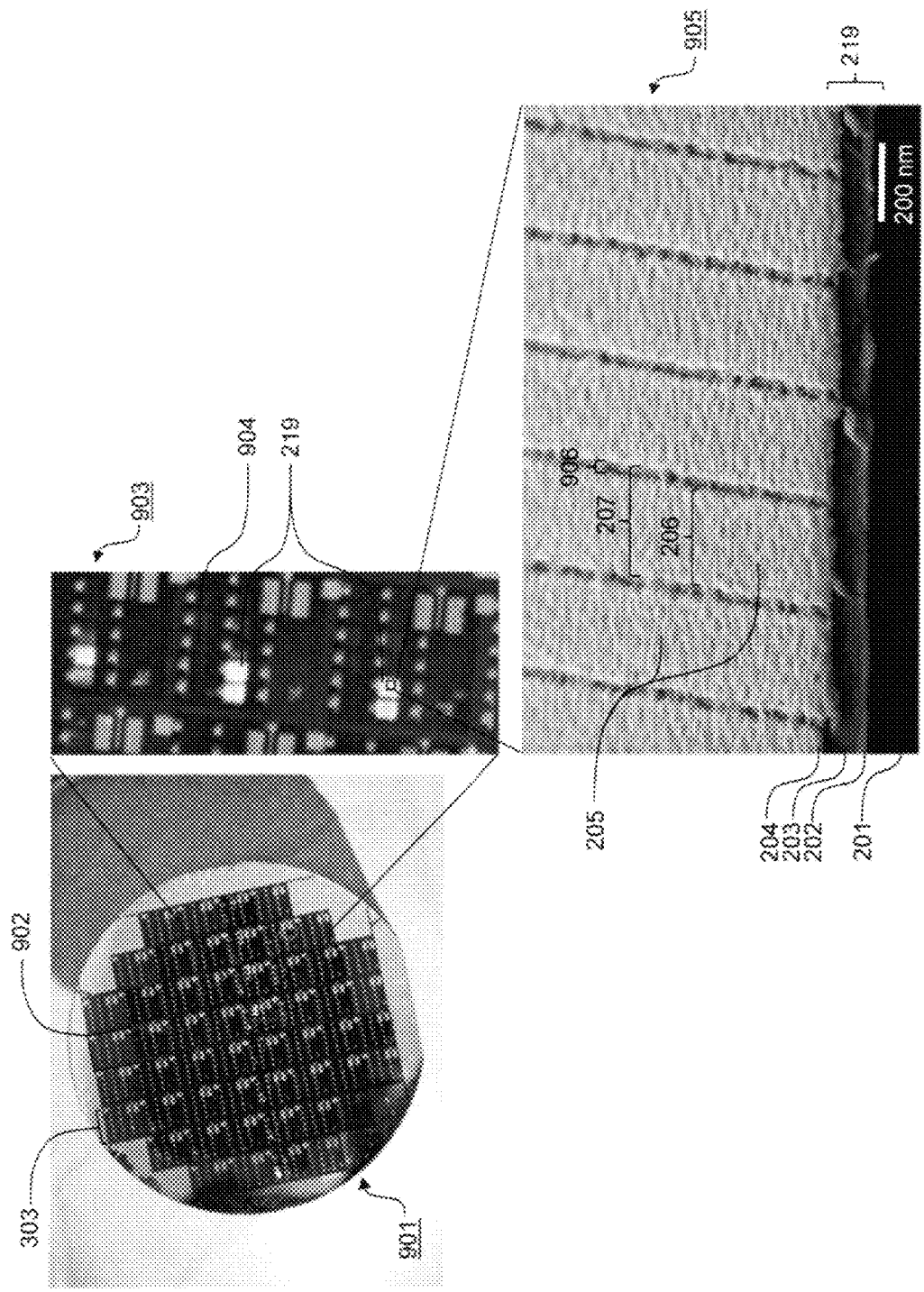
FIG. 9 is a photograph illustrating a wafer device structure with details of an integrated resonance detector.

FIG. 9 shows photograph 901 with specific examples of integrated resonance detectors 220. Photograph 901 illustrates multiple dies 902 (total of fifty-two) on the wafer of large arrays 303 of integrated resonance detectors 220. In this example, large array 303 was fabricated using lithographic processing techniques. As part of the process, nanoscale patterning techniques such as nanoimprint lithography were used to define the patterned features 205 in patterned conductor layer 204. Nanoimprint-patterned conductor layer 204 appears bright in photo inset 903 due to diffraction of room lighting. When feature dimensions 205 of patterned conductor layer 204 in integrated resonance detector 220 are smaller than the wavelength of visible light, they appear dark in the photograph, for example in the region indicated by 904. Different shadings (colors) are observed in photo inset 903 for different sizes of patterned features 205.

Scanning electron micrograph (SEM) 905 illustrates a specific example of an integrated resonance detector 220. In this example, a silicon wafer is used as substrate 201. Conducting mirror layer 202 is a trilayer metal stack consisting of chromium (1.5 nm)-gold (97 nm)-chromium (1.5 nm). Chromium is used as an adhesion promoter, or tie layer for bonding gold to inorganic layers and is well known in the art. Active layer 203 consists of a single indium oxide ($In_2O_3$) 100 nm thick layer. Active layer deposition is followed by deposition of patterned conductor layer 204 which, like the mirror layer, is composed of a chromium (1.5 nm) tie layer and a final 100 nm of gold. Nanoimprint lithography is employed to create the patterned features 205 in patterned conductor layer 204. Nanoimprint lithography provides a means to define features using a quartz template that has been defined using an electron beam lithography processing step and is described by Sreenivasan et al. U.S. Pat. No. 6,900,881, which is hereby incorporated by reference. Nanoimprint lithography can be used to stamp and repeat the entire die pattern 902 during a single imprint processing step. This process enables an entire large array 303 of integrated resonance detectors to be fabricated in a batch step. In the example in FIG. 9, the feature width 206 is 230 nm and feature pitch 207 is 315 nm. The feature gap 906, defined as the width of the area that is voided of patterned conductor layer 204, is a pronounced feature of SEM micrograph 905 in the specific example. Definition of patterned conductor layer 204 completes the formation of resonance structure 219 which becomes integrated resonance detector 220 (not shown) when connected to an external electric circuit.

Figure 10:
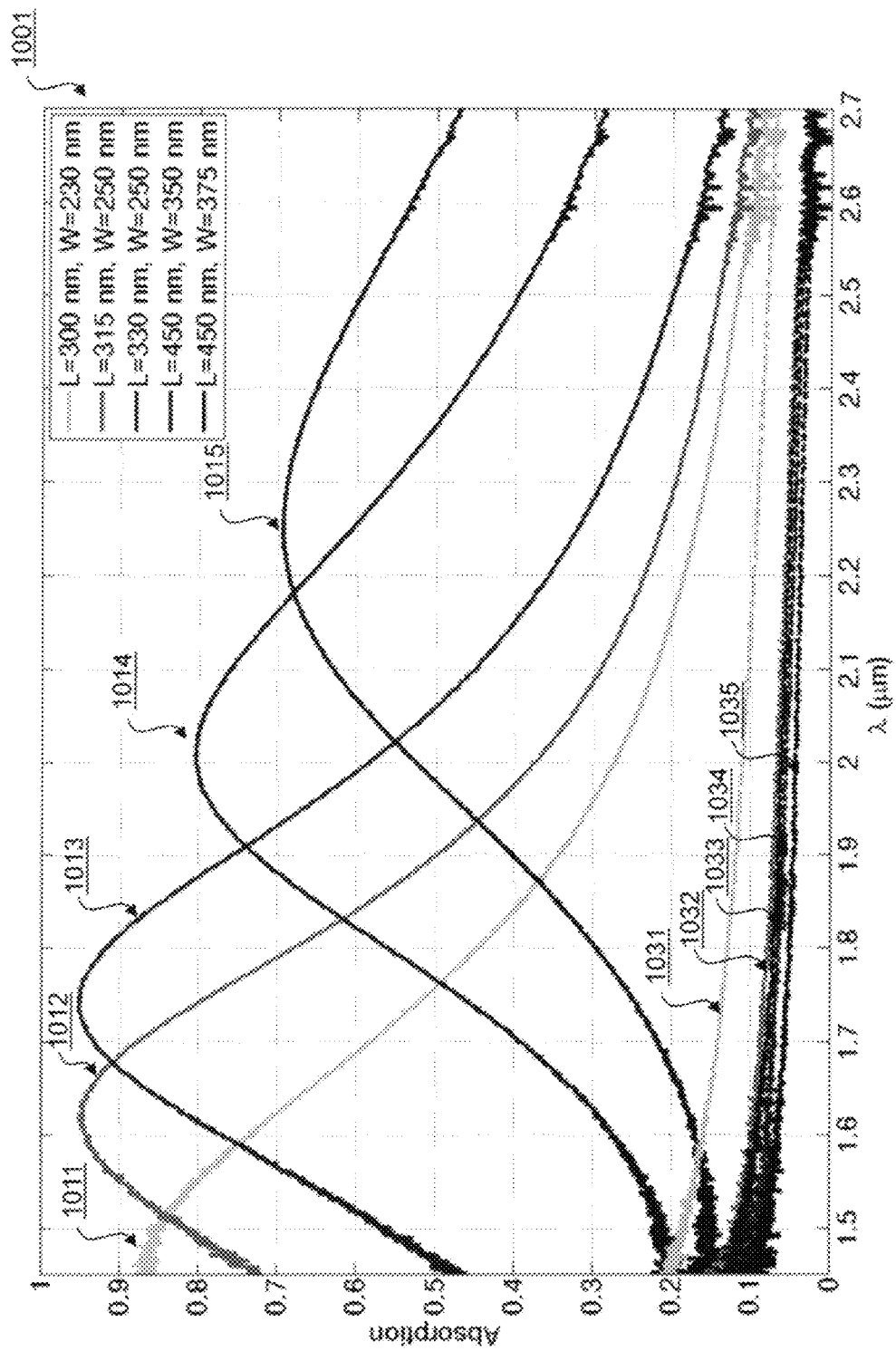
FIG. 10 is a plot illustrating the change in peak resonance absorption based on the feature dimensions of the patterned conductor layer of the integrated resonance detector.

FIG. 10 shows a plot of the absorption vs. wavelength measured with an infrared (IR) spectrometer for a series of integrated resonance detectors 220. The absorption curves demonstrate that for any specified patterned feature dimensions 205, there exists a peak absorption wavelength when the integrated resonance detector 220 is irradiated with linearly-polarized radiation with an electric field orientation that is perpendicular to the long axis of patterned features 205. A second set of curves illustrates that no peak absorption occurs when linearly-polarized light is parallel to the long axis of patterned features 205 of patterned conductor layer 204. For linearly-polarized light perpendicular to the long axis of patterned features 205, the wavelength of peak absorption changes when patterned feature dimensions 205 of patterned conductor layer 204 are changed. Data graph 1001 shows both sets of curves for each of the five different feature dimensions 205 included in array die 902 for an example large array 303 of integrated resonance detectors 220. For the data set, the feature dimensions are defined as the feature width (W) 206 and feature pitch (L) 207. The five curves for linearly-polarized light perpendicular to the long axis include line 1011 (L=300 nm, W=230 nm, $\lambda_{max}$=1.40 µm); line 1012 (L=315 nm, W=250 nm, $\lambda_{max}$=1.62 µm); line 1013 (L=330 nm, W=250 nm, $\lambda_{max}$=1.74 µm); line 1014 (L=450 nm, W=350 nm, $\lambda_{max}$=2.00 µm); and line 1015 (L=450 nm, W=375 nm, $\lambda_{max}$=2.25 µm). Likewise, the respective curves for linearly-polarized light parallel to the long axis are line 1031 (L=300 nm, W=230 nm); line 1032 (L=315 nm, W=250 nm); line 1033 (L=330 nm, W=250 nm); line 1034 (L=450 nm, W=350 nm); and line 1035 (L=450 nm, W=375 nm), and are plotted over the same range of wavelengths. However, absorption of linearly-polarized light parallel to the long axis is low compared to perpendicular linearly-polarized light indicating that the light is non-interacting with the resonance structure 219. The absorption data are demonstrated without connection to an external circuit 218. Connection of resonance structure 219 to an external circuit would produce integrated resonance detector 220. In the event the devices are connected to an external circuit 218, analogous peaks in electric current 212 vs. wavelength 209 curves would be observed. The sharpness, or Q-factor for the absorption width and peak absorption are dependent on a number of physical variables including the number of consecutive patterned conducting layers 204 that are deposited and patterned.

Figure 11:
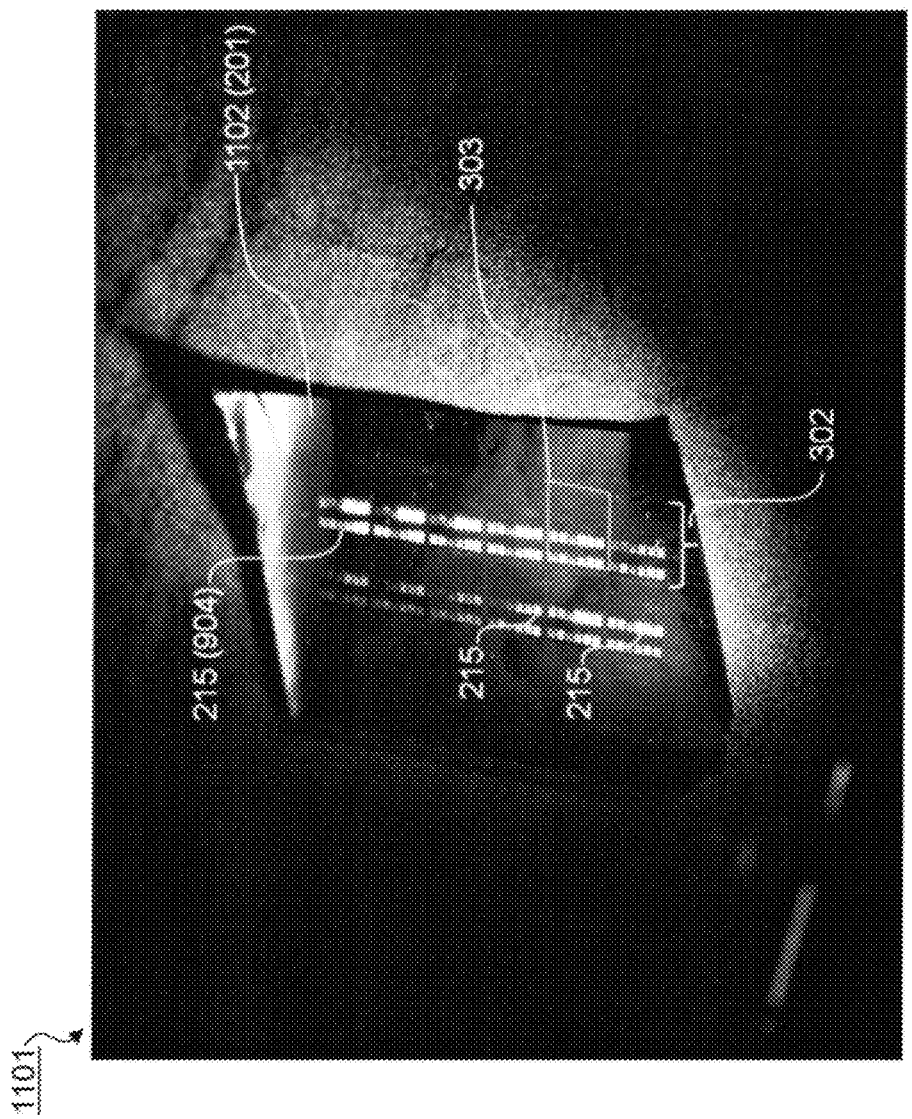
FIG. 11 is a photograph illustrating fabrication of an array of integrated resonance detectors onto a flexible Kapton® substrate.

Another embodiment of a large array 303 of integrated resonance detectors 220 is illustrated in FIG. 11. The composition of substrate 201 consists of a metalized (aluminum) Kapton® film 1102 that is coated with a thin active layer ($In_2O_3$) 203 followed by deposition of the imprinted photoresist that is used to pattern patterned conducting layer 204. In this example, large array 303 with individual integrated resonance detectors 220 are not connected to external circuits 218. As was demonstrated in FIG. 9, some of integrated resonance detectors 220 appear as bright spots due to room light diffraction and others 904, have feature dimensions 205 that are too small to cause diffraction of visible light. Fabrication of integrated resonance detectors 220 onto flexible substrates opens new manufacturing possibilities for photodetector arrays that are not possible when rigid wafer substrates are employed. Numerous possibilities exist for flexible substrates and material compositions that could comprise substrate 201.

Large arrays 303 of integrated resonance detectors 220 may be used in a number of optical detection applications. One embodiment, such as that depicted previously in FIG. 8, is to enable near infrared and short wave infrared detection with visible detection using a monolithic image sensor as the substrate. In this embodiment, broad wavelength detection will not require secondary focal plane arrays such as InGaAs, InSb, or HgCdTe which have cost ratios>1000 times that of silicon detectors. Infrared focal plane arrays are manufactured for different regions of the infrared from near infrared (NIR) to long-wave infrared (LWIR). Infrared focal plane arrays are commercially available (e.g., Goodrich; Princeton, N.J., USA and FLIR Systems Inc.; Boston, Mass., USA).

In another embodiment, a silicon CMOS image sensor could be designed to include integrated resonance detectors 220 and the image sensor color filter array would be redesigned to accommodate the infrared "pixels" composed of integrated resonance detectors 220 via elimination of select color filter elements and/or expansion of the traditional 2×2 Bayer filter pattern for color analysis (U.S. Pat. No. 3,971, 065). A Bayer CFA comprises an alternating pattern composed of one red, two green, and one blue filter, each in registration with a single image detector pixel. This type of pattern is referred to as a 2×2 pixel pattern, because the pattern has 4 pixels in a 2×2 arrangement.

In one embodiment disclosed herein, a silicon CMOS image sensor is made to have a variety of CFA patterns including a 2×2 pixel pattern such as that used by a Bayer color filter array that incorporates at least some fraction of integrated resonance detectors 220 in place of CFA elements. The degree of incorporation depends on the desired application. Embodiments can be conceived where only a single element is replaced to accommodate infrared detection. Conversely, embodiments can be conceived where all but one color element is incorporated in the infrared array.

In other aspects of the invention, image sensor arrays with at least one integrated resonance detector 220 are made to have 3×3 pixel patterns, 4×4 pixel patterns, 5×5 pixel patterns and/or up to N×N pixel patterns, where N is limited by the number of electrically addressable pixels in the array. In still other aspects of the invention, image sensor arrays with at least one integrated resonance detector comprise one or more different pixel patterns. Expanding the size of the pixel pattern from a typical 2×2 pattern to a 3×3, 4×4, 5×5, or higher pixel patterns enables expansion of a spectroscopic mosaic set beyond the standard RGB and CMYK patterns currently used in visible filtering systems for cameras and other optics. The expanded mosaic may include any number of integrated resonance detectors 220 that absorb light in the NIR or SWIR regions designed by changing the feature dimensions 205 of the patterned conductor layer 204. Furthermore, array dimensions may be asymmetric, for example a repeated 2×3, 2×4, 2×5, 2×7, 2×10, 2×17, 2×51, 2×200, 2×1000, 3×4, 3×9, 3×300, 10×100 may be created. This can enable higher spectral definition, accommodate higher color fidelity, and can provide for the resolution of spectroscopically similar wavelengths of ultraviolet, visible and infrared radiation in applications such as combined photography and thermography and laser threat detection identification, to name a few. Array dimensions need not be square, or rectangular and may take the form of any repeatable geometric shape.

An array of integrated resonance detectors may also be fabricated on a substrate that contains electric circuits, for the purposes of amplifying, digitizing, or otherwise converting the currents from the array of integrated resonance detectors into electrical signals. In some cases, it is useful for the substrate electric circuits to be connected to a combination of photodetectors with spectral responses inherent to the materials comprising the photodetectors, and integrated resonance detectors provided in the present invention. For example, it may be advantageous to provide an array of integrated resonance detectors with dimensions designed to detect radiation in the mid-wave infrared band, on a substrate that contains an array of silicon photodetectors, which are primarily sensitive to radiation in the visible and near-infrared bands. The combination of detection capability across the visible, near-infrared, and mid-wave infrared bands afforded by a single device that combines certain embodiments of the present invention with conventional photodetectors known in the art solves a difficult problem of utility in the formation of spectrally-resolved imaging of scenes. As a particular, non-limiting example, an array of integrated resonance detectors of the present invention, with dimensions designed to provide detection of radiation in a number of wavelength intervals across the short-wavelength infrared band (0.9 µm-2.1 µm), fabricated on a silicon photodetector array with a Bayer filter mosaic (RGB) and electronic amplification circuitry for both the individual silicon photodetectors and the individual integrated resonance detectors, can be used as a focal-plane detector for a hyperspectral imaging system.

In the present invention, instances where the integrated resonance detectors are combined with photodetectors may include a color filter array as part of the system. The color filter mosaic may be present only on the photodetector elements, or it may be included on both the photodetector elements and on the integrated resonance detectors. In the case where the color filter element is deposited on an integrated resonance detector, the layer would serve to pre-filter light to a specific spectroscopic region which would then be further spectroscopically narrowed by virtue of the resonance interaction with the incident light. This may be useful, for example, in background rejection or enhancing the dynamic range of detection for specific imaging applications or laser threat detection.

An integrated resonance detector array may contain many regions of wavelength selectivity. In various aspects of the invention, groupings of detection pixels may occur to increase the wavelength spectral range, the dynamic range of detection, or the sensitivity of the response for a given narrow range of wavelengths. An example of narrow wavelength selectivity would be wavelength division multiplexing. In other embodiments of the invention, detector array 303 provides for a broad detection capability ranging from the ultraviolet through far infrared region of the electromagnetic spectrum. In other embodiments, selected broad ranges of wavelengths may be used for solar radiation detection, energy conversion or collection. The integrated resonance detector array of the present invention would provide for both a monolithic detector array or an arrangement of individual sensor elements in an array, each embodiment possessing a mosaic of individual detector elements specific to a given wavelength of resonance coupling. Broad wavelength detector arrays capable of spanning a large spectroscopic range as a monolithic detector (i.e., not requiring stitching of multiple detection systems from visible to far infrared) are not known in the art.

In some embodiments, the resonance structure in an integrated resonance detector can be designed specifically to retain its wavelength-selective characteristics over a broad range of incident angles. This feature provides an advantage over some other methods of wavelength selectivity used in the art. For example, thin-film interference or Fabry-Perot filters have narrow angular acceptance for a given center selected wavelength (S.-W. Han, et al. "Multilayer Fabry-Perot microbolometers for infrared detection" Infrared and Millimeter Waves and 13th International Conference on Terahertz Electronics, 2, p. 646, 2005). Wide angle selectivity of the integrated resonance structures has been demonstrated in the literature (Avitzour, Y. et al., "Wide-angle infrared absorber based on a negative-index plasmonic metamaterial" *Phys. Rev. B* 79(4) p. 045131, 2009 and Chihhui, W. et al., "Ultra-thin wide-angle perfect absorber for infrared frequencies" *SPIE—The Intl. Soc. For Optical Eng.* 7029, p. 70290W-7015, 2010).

Several specific applications are enabled by embodiments of the invention including electromagnetic sensor arrays, energy collection such as solar energy, and logic circuits that can spatially and spectrally resolve incident light by virtue of fabricating a large number of detectors, each detector having feature dimensions tailored to be resonant within a narrow, but different band of wavelengths. Such a device architecture could be useful, for example, in the fabrication of a hyperspectral detector that is used as a focal plane array in an imaging system, spectral encoding of optical logic circuitry that provides a means for dense logic element packaging, and wavelength division multiplexing of narrow optical communication bands. Furthermore, the material composition of the device could be selected for high temperature operation, making possible applications such as thermophotovoltaic energy conversion.

It is understood that modifications to the invention may be made as might occur to one skilled in the field of the invention within the scope of the appended claims. All embodiments contemplated hereunder which achieve the objects of the invention have not been shown in complete detail. Other embodiments may be developed without departing from the spirit of the invention or from the scope of the appended claims. Although the present invention has been described with respect to specific details, it is not intended that such details should be regarded as limitations on the scope of the invention, except to the extent that they are included in the accompanying claims.

We claim:

1. A method for making an integrated resonance detector for electromagnetic radiation, comprising:
   (a) providing a substrate comprising a conducting mirror layer, the mirror layer having electrical continuity to a first electrode;
   (b) depositing an active layer on the mirror layer;
   (c) depositing a conducting layer on the active layer, the conducting layer having electrical continuity to a second electrode;
   (d) patterning the conducting layer, wherein the patterned conducting layer is selected to absorb electromagnetic radiation within a selected range of wavelengths; and
   (e) connecting an electrical circuit between the first electrode and the second electrode.

2. The method of claim 1 wherein the conducting layer is patterned by dry etching.

3. The method of claim 1 wherein the conducting layer is patterned with a liftoff process.

4. The method of claim 1 wherein the active layer is deposited using evaporation, sputtering, chemical vapor deposition, spin-on, or casting.

5. The method of claim 1 further comprising depositing a second active layer on the patterned conductive layer.

6. The method of claim 5 further comprising depositing a second patterned conducting layer on and in registration with the second active layer.

7. The method of claim 1 wherein the conducting layer is patterned by photolithography or nanoimprint lithography.

8. The method of claim 1 wherein the electrical circuit comprises a focal plane array, image sensor, or bolometer.

9. A method for making an integrated resonance detector for electromagnetic radiation, comprising:
   (a) providing a substrate comprising a conducting mirror layer, the mirror layer having electrical continuity to a first electrode;
   (b) depositing an active layer on the mirror layer;
   (c) patterning the active layer;

(d) depositing a conducting layer on the patterned active layer, the conducting layer having electrical continuity to a second electrode and defining a specific wavelength of absorption; and (e) connecting an electrical circuit between the first electrode and the second electrode.

10. The method of claim 9 wherein the active layer is deposited using evaporation, sputtering, chemical vapor deposition, spin-on, or casting.

11. The method of claim 10 further comprising depositing a second active layer on the patterned conductive layer.

* * * * *